United States Patent
Campbell et al.

(10) Patent No.: US 6,677,250 B2
(45) Date of Patent: Jan. 13, 2004

(54) CVD APPARATUSES AND METHODS OF FORMING A LAYER OVER A SEMICONDUCTOR SUBSTRATE

(75) Inventors: Philip H. Campbell, Meridian, ID (US); Craig M. Carpenter, Boise, ID (US); Ross S. Dando, Nampa, ID (US); Kevin T. Hamer, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 343 days.

(21) Appl. No.: 09/932,711

(22) Filed: Aug. 17, 2001

(65) Prior Publication Data

US 2003/0033980 A1 Feb. 20, 2003

(51) Int. Cl.$^7$ ................................................ H01L 21/31
(52) U.S. Cl. ...................... 438/758; 438/691; 438/689; 438/29; 430/327; 156/643
(58) Field of Search ................................. 438/758, 759, 438/760

(56) References Cited

U.S. PATENT DOCUMENTS

| | | | |
|---|---|---|---|
| 3,110,319 A | 11/1963 | Arata et al. | |
| 4,273,291 A | 6/1981 | Muller | |
| 4,319,737 A | 3/1982 | Waterfield | |
| 4,805,552 A | 2/1989 | Pagendarm et al. | |
| 4,872,947 A | * 10/1989 | Wang et al. ................... | 216/38 |
| 5,000,113 A | * 3/1991 | Wang et al. ............. | 118/723 E |
| 5,002,928 A | 3/1991 | Fukui et al. | |
| 5,150,734 A | 9/1992 | Chiba | |
| 5,362,526 A | * 11/1994 | Wang et al. ................. | 427/573 |
| 5,547,714 A | 8/1996 | Huck et al. | |
| 5,564,907 A | 10/1996 | Maruyama et al. | |
| 5,678,595 A | 10/1997 | Iwabuchi | |
| 5,743,457 A | 4/1998 | Benedette et al. | |
| 5,885,358 A | 3/1999 | Maydan et al. ............. | 118/723 |
| 6,056,994 A | 5/2000 | Paz de Araujo et al. | |
| 6,228,563 B1 | * 5/2001 | Starov et al. ................ | 430/327 |
| 6,333,268 B1 | * 12/2001 | Starov et al. ................ | 438/691 |
| 2002/0155632 A1 | * 10/2002 | Yamazaki et al. ............ | 438/29 |
| 2003/0045098 A1 | * 3/2003 | Verhaverbeke et al. ..... | 438/689 |

OTHER PUBLICATIONS

U.S. patent application Ser. No. 09/810,387, Carpenter et al., filed Mar. 15, 2001.

* cited by examiner

Primary Examiner—John F. Niebling
Assistant Examiner—Olivia T Luk
(74) Attorney, Agent, or Firm—Wells St. John P.S.

(57) ABSTRACT

The invention includes a method of forming a layer on a semiconductor substrate that is provided within a reaction chamber. The chamber has at least two inlet ports that terminate in openings. A first material is flowed into the reaction chamber through the opening of a first of the inlet ports. At least a portion of the first material is deposited onto the substrate. The reaction chamber is purged by flowing an inert material into the reaction chamber through the opening of a second of the inlet ports. The inert material passes from the opening and through a distribution head that is positioned within the reaction chamber between the first and second openings. A second material can then be flowed into the chamber through an opening in a third inlet port and deposited onto the substrate. The invention also includes a chemical vapor deposition apparatus.

19 Claims, 1 Drawing Sheet

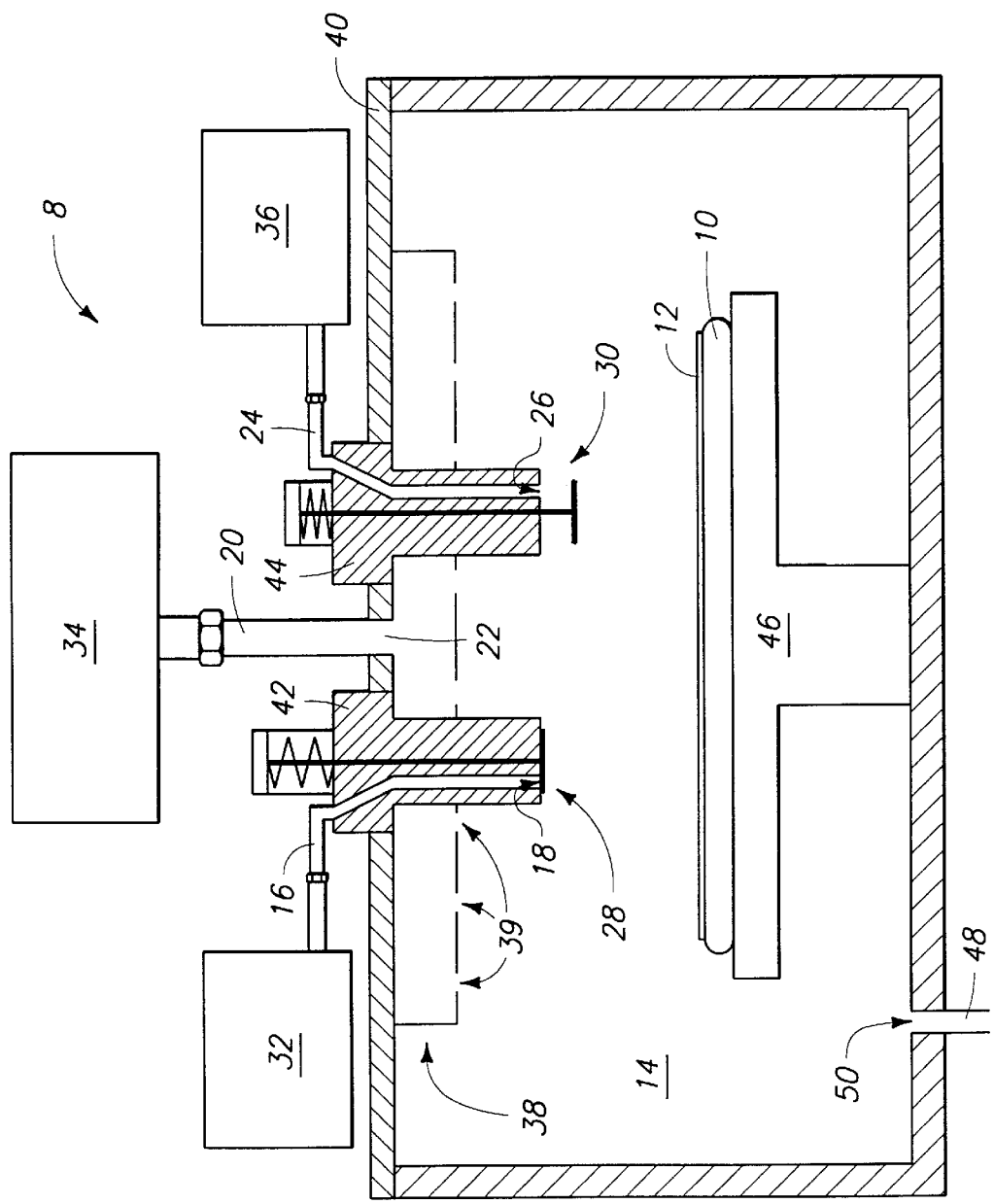

CVD APPARATUSES AND METHODS OF FORMING A LAYER OVER A SEMICONDUCTOR SUBSTRATE

TECHNICAL FIELD

The present invention pertains to CVD apparatuses and methods for forming layers over a semiconductor substrate.

BACKGROUND OF THE INVENTION

Methods of chemical vapor deposition (CVD) are used to produce thin layers of material during various industrial processes including semiconductor device fabrication. CVD methods involve introduction of vaporized precursor materials into a reactor, adsorption of the vapor precursor materials onto a surface of a semiconductor substrate and eventual incorporation of such precursor materials into solid films.

Sequential introduction of various precursors into a CVD apparatus may result in undesirable mixing of precursors in areas of the apparatus other than on the semiconductor substrate, such as within a common supply line or within the chamber itself. The first precursor material is purged from the chamber after adsorption onto the semiconductor substrate and prior to introduction of a second precursor material to avoid undesirable mixing.

In conventional CVD processes incomplete purging may occur due to precursor material becoming trapped within an area of the reaction chamber. Such incomplete purging may result in unwanted mixing of precursor materials upon the introduction of the second precursor and may lead to adsorption of precursor materials and adduct formation upon reaction chamber surfaces. Adduct materials that form on the reaction chamber surfaces may precipitate onto the substrate and cause defects in the thin layer formation.

Accordingly it is desirable to provide CVD apparatuses and deposition methods that are designed to minimize unwanted mixing and unwanted deposition of films onto apparatus surfaces.

BRIEF DESCRIPTION OF THE DRAWING

Preferred embodiments of the invention are described below with reference to the following accompanying drawing.

The FIGURE shows a diagram of a deposition chamber and a related process chemical delivery system according to an embodiment of the present invention.

SUMMARY OF THE INVENTION

In one aspect, the invention encompasses a method of forming a layer on a semiconductor substrate. A semiconductor substrate is provided within a reaction chamber. The chamber has at least two inlet ports extending therein. A first of the at least two inlet ports terminates in a first opening which is a first distance from the substrate. A second of the inlet ports terminates in a second opening which is a second distance from the substrate. The second distance is greater than the first distance. A first material is flowed into the reaction chamber through the first inlet port. At least a portion of the first material is deposited onto the substrate to form the layer over the substrate. The reaction chamber is purged by flowing an inert material into the reaction chamber through the second inlet port.

In another aspect, the invention encompasses a method of chemical vapor deposition. A substrate is provided within a reaction chamber. The reaction chamber includes a lid. The reaction chamber also includes a first valve assembly and a second valve assembly. Each valve assembly includes a valve closure. The reaction chamber also includes an inert material inlet port which is distinct from the valve assemblies. The first and second valve assemblies, as well as the inert material inlet port pass through the lid of the reaction chamber. A first material is flowed into the chamber through the first valve closure, and at least a portion of this first material is deposited onto the substrate. The reaction chamber is purged by flowing an inert material through the inert material inlet port. The inert material passes through the inert material inlet port and through a distribution head. The distribution head is positioned within the reaction chamber between the lid and the first and second valve closures. Once the first material has been deposited, a second material is flowed into the chamber through the second valve closure. At least a portion of the second material is deposited onto the substrate.

In another aspect the invention encompasses a chemical vapor deposition apparatus. The apparatus includes a deposition chamber and a substrate platform. Two or more inlet ports extend into the deposition chamber. A first of the inlet ports terminates in a first opening which is a first distance from the substrate platform. A second of the inlet ports terminates in a second opening that is a second distance from the substrate platform. The second distance is greater than the first distance. The apparatus also includes a porous distribution head within the chamber located between the first and second openings.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

The present invention is described with reference to the FIGURE. A method of forming a layer 12 over a semiconductor substrate 10 is shown. The semiconductor substrate 10 is provided within an apparatus 8 comprising a reaction chamber 14. The reaction chamber 14 has at least two inlet ports 16 and 20. A first of the at least two inlet ports 16 terminates in a first opening 18 a first distance from the substrate. A second of the at least two inlet ports 20 terminates in a second opening 22 a second distance from the substrate. A first material 32 is flowed into the reaction chamber 14 through the first inlet port 16. At least a portion of first material 32 is deposited onto substrate 10 to form a layer 12.

An inert material 34 is flowed into the reaction chamber through the second inlet port 20 to purge the reaction chamber. The flowing of the inert material can occur while flowing the first material. Alternatively, flowing the inert material may occur after deposition of the first material or both during and after deposition of the first material. The flow of inert material can be pulsed or continuous. It is advantageous to continuously flow the inert material while flowing the first material to assist in moving the first material away from the area of the chamber around first inlet port 16 and reduce adduct formation on reaction chamber surfaces. It is also advantageous to purge the chamber by flowing the inert material from an opening located a greater distance from the substrate than the opening through which the first material is provided to reduce, or even minimize retention of first material within the reaction chamber.

The inert material 34 preferably comprises a fluid that is inert to reaction with the substrate 10, with the first material 32, and with materials subsequently introduced into the chamber for deposition. The inert material can comprise a gas. Exemplary gases can be helium, argon or nitrogen or mixtures thereof. Preferably when the inert material 34 comprises a gas, the gas is flowed into the chamber at a rate no greater than about 100 standard cubic centimeters per minute (sccm).

The second inlet port 20 can be behind the porous distribution head 38. The distribution head 38 can be located within the reaction chamber 14 between the first opening 18 and the second opening 22. It is advantageous to provide the inert material from behind a porous distribution head where the distribution head is positioned between the first and the second openings to result in a downward flow of inert material. The downward flow can both minimize counter-flow of the first material and assist in the diffusion of the first material over the substrate. In addition, the downward flow can alleviate unwanted adsorption of first material onto surfaces within the reaction chamber.

After deposition of the first material 32, a second material 36 can be flowed into the reaction chamber. The second material 36 is flowed into reaction chamber 14 through a third inlet port 24. The third inlet port 24 terminates in a third opening 26 which is a third distance from the substrate 10. The second distance is greater than the third distance. At least a portion of the second material 36 is deposited onto the substrate 10. It is advantageous to flow the second material through an inlet port that is distinct from the inlet port through which the first material passes rather than through a common inlet port because unwanted mixing of the first and second materials within an inlet port is thereby minimized. It is to be understood, however, that the methods described herein may be adapted to processes that provide a first material and a second material through a common inlet port.

While flowing the second material, the reaction chamber may again be purged by flowing an inert material through the second inlet port as described above. Alternatively, the inert material may be flowed after flowing the second material or both during and after the flowing of the second material. A series of multiple rounds of deposition of reactive materials onto the substrate, accompanied either by a simultaneous flowing or by a subsequent flowing of inert material through of the reaction chamber according to the method described herein, are contemplated in the present invention.

Numerous chemicals can be utilized for first material 32 and for second material 36 for purposes of the present invention. Exemplary combinations include a first material comprising trimethyl aluminum and a second material comprising one or both of water and ozone; or a first material comprising $TiCl_4$ where the second material comprises ammonia; or a first material comprising $Ta_2O_5$ where the second material comprises ammonia.

A second aspect of the invention encompassing a method of chemical vapor deposition is described with reference to the FIGURE. A substrate 10 is provided within a reaction chamber 14. The reaction chamber 14 includes a lid 40, a first valve assembly 42 having a first valve closure 28, and a second valve assembly 44 having a second valve closure 30. An inert material inlet port 20 is provided into the reaction chamber 14, the inert material inlet port 20 being distinct from the valve assemblies 42 and 44. In this aspect of the invention, one, two or all three of the first valve assembly 42, the second valve assembly 44 and the inert material inlet port 20 can pass through the lid 40. A first material 32 is flowed into the reaction chamber 14 through the first valve closure 28. At least a portion of the first material 32 is deposited onto the substrate 10.

After the first material 32 is deposited onto the substrate 10, the reaction chamber 14 and the valve closures 28, 30 are purged by flowing an inert material 34 through the inert material inlet port 20 into the reaction chamber. Alternatively, inert material 34 can be flowed through the reaction chamber while flowing first material 32. The inert material 34 is passed from the inert material inlet port 20 through a distribution head 38. The distribution head 38 is within the reaction chamber 14 and between the lid 40 and the first and second valve closures. The purging of the reaction chamber and valve closures can utilize, for example, a distribution head 38 that is a gas dispersion head in combination with an inert material 34 comprising a gas. The inert material is removed from the reaction chamber through an outlet port 48.

After deposition of first material 32, a second material 36 can be flowed through the second valve closure 30 into the reaction chamber 14. At least a portion of the second material 36 is deposited onto the substrate 10. Inert material 34 can be flowed into the reaction chamber simultaneously with the flowing of the second material, can be flowed after the flowing of the second material, or can be flowed both during and after the flowing of the second material.

Still referring to the FIGURE, chemical vapor deposition apparatus 8 includes a deposition chamber 14 and a substrate platform 46. The apparatus 8 includes at least two inlet ports 16 and 20, and at least one outlet port 48, that extend into the chamber 14. A first of the at least two inlet ports 16 terminates in a first opening 18. There is a first distance between the substrate platform 46 and the first opening 18. A second of the at least two inlet ports 20 terminates in a second opening 22. There is a second distance between the substrate platform 46 and the second opening 22. The second distance is greater than the first distance. The at least one outlet port 48 terminates in an opening 50. The apparatus 8 can also include a porous distribution head 38 within the chamber 14. The porous distribution head 38 is positioned between the first opening 18 and the second opening 22.

The shown apparatus 8 includes a lid 40. The first inlet port 16, or the second inlet port 20, or both can pass through the lid, and in the shown embodiment, inlet ports 16 and 20 both pass through the lid. In alternative embodiments, at least one of the inlet ports can access the chamber through an area of apparatus 8 other than through the lid. For instance, one or more of inlet ports 16 and 20, may pass through a chamber wall.

Outlet port 48 can access the chamber though the lid or through areas of apparatus 8 other than the lid. It is advantageous for the outlet port to access the chamber through a surface opposing the surface through which at least the second inlet port 22 passes to assist in maintaining directional flow of precursor gas away from the surface through which the second inlet port passes. A directional flow can aid in removal of reactive materials from the reaction chamber and thereby reduce or minimize adduct formation on surfaces near the second inlet port and other surfaces within the reaction chamber.

The porous distribution head 38 of the apparatus 8 is not limited to a specific size and may, for example, extend across less than the entire length of the chamber 14. One example of a distribution head which may be utilized in the present invention is a gas dispersion head.

The porous distribution head 38 of the present invention is not limited to a specific material but may comprise, for example, aluminum such as anodized aluminum. In addition, the size of the distribution head pores 39 and the distance between the pores are not limited to specific values. An exemplary pore diameter is about 0.040 inches. The distance between the pores of the distribution head may be measured by the distance between the center point of one pore and the center point of a neighboring pore. For purposes of this invention, this center to center distance between pores can be, for instance, a distance of not greater than about 0.100 inches.

In addition to the features described above, an apparatus encompassed by the present invention may also include a third inlet port 24. The third inlet port 24 terminates in a third opening 26 which is a third distance from the substrate platform 46. The third distance is less than the second distance. In the shown embodiment, the third inlet port 24 passes through the lid 40 of apparatus 8, but can also enter the chamber though an alternative area of the apparatus such as a chamber wall.

The distance between the first opening and the substrate platform (the first distance) and the distance between the third opening and the substrate platform (the third distance) are not limited to specific values. The first and the third distance can be equal. Either the first distance or the third distance or both are preferably from about 28 mm to about 30 mm.

The second inlet port 22 of the apparatus can be located behind the porous distribution head 38. The distribution head 38 is within the reaction chamber 14 and between the first opening 18 and the second opening 22 and, in embodiments comprising a third inlet port, also between the second opening 22 and the third opening 26.

The inlet ports encompassed by the present invention are not limited to any specific form. One or more of the inlet ports in the apparatus may be comprised by a valve assembly 42 and 44. Further, a valve assembly can comprise a valve closure 28, 30. The valve closure is not intended to be limited to a specific mechanism and can be, for instance, located at an opening that terminates an inlet port 18, 26, such closure being capable of sealing access from the respective inlet port into the reaction chamber 14.

An apparatus configuration wherein the inert material is flowed from behind a porous distribution head, the distribution head being farther from the substrate than the valve closure, is advantageous because the downward flow of inert material can assist in preventing counter-flow of first and second materials into the opposite valve.

In the shown embodiment, valve assemblies 42 and 44 pass through the lid 40. Alternatively, one or both of the valve assemblies can access the chamber through other areas of the apparatus 8. For instance, one or both of the valve assemblies can pass though the chamber wall.

The advantages conferred by the present invention can make the invention particularly suitable for processes where an efficient purge is necessary to prevent unwanted mixing of reactive chemicals and adduct formation upon exposed surfaces within a reaction chamber. Such processes include atomic layer deposition.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A method of forming a layer over a semiconductor substrate, comprising:

providing the semiconductor substrate within a reaction chamber, said chamber having at least two inlet ports extending therein, a first of the at least two inlet ports terminating in a first opening a first distance from the substrate and a second of the at least two inlet ports terminating in a second opening a second distance from the substrate, the second distance being greater than the first distance;

flowing a first material into the reaction chamber through the first inlet port, and depositing at least a portion of the first material onto the substrate to form the layer over the substrate; and flowing an inert material into the reaction chamber through the second inlet port to purge the reaction chamber.

2. The method of claim 1 wherein the second inlet port is behind a porous distribution head; said distribution head being within the reaction chamber and between the first and second openings.

3. The method of claim 1 wherein the flowing the inert material comprises flowing the inert material while flowing the first material.

4. The method of claim 1 wherein the flowing the inert material comprises flowing the inert material after flowing the first material.

5. The method of claim 1 wherein the inert material comprises a fluid.

6. The method of claim 1 wherein the inert material comprises a gas, the gas being inert relative to reaction with either the substrate or the first material.

7. The method of claim 6 wherein the gas comprises at least one of helium, argon and $N_2$.

8. The method of claim 6 wherein the gas is flowed at a rate no greater than about 100 sccm.

9. The method of claim 1 further comprising:

after flowing the first material into the reaction chamber, flowing a second material into the reaction chamber through a third inlet port, the third inlet port terminating in a third opening a third distance from the substrate, the second distance being greater than the third distance; and depositing at least a portion of the second material onto the substrate.

10. The method of claim 9 wherein the first material comprises trimethyl aluminum and the second material comprises one or both of water and ozone.

11. The method of claim 9 wherein the first material comprises $TiCl_4$ and the second material comprises ammonia.

12. The method of claim 9 wherein the first material comprises $Ta_2O_5$ and the second material comprises ammonia.

13. A method of chemical vapor deposition comprising:

providing a substrate within a reaction chamber wherein the reaction chamber comprises a lid, a first valve assembly having a first valve closure, a second valve assembly having a second valve closure, and an inert material inlet port, said inert material inlet port being distinct from the valve assemblies and wherein the first and second valve assemblies and the inert material inlet port pass through the lid;

flowing a first material into the reaction chamber through the first valve closure, and depositing at least a portion of the first material onto the substrate;

after flowing the first material into the reaction chamber, purging the the reaction chamber by flowing an inert material through the inert material inlet port into the reaction chamber whereby the inert material passes from the inert material inlet port through a distribution head, said distribution head being within the reaction chamber and between the lid and the first and second valve closures; and after purging the reaction chamber, flowing a second material into the reaction chamber through the second valve closure, and depositing at least a portion of the second material onto the substrate.

14. The method of claim 13 wherein the inert material comprises a gas; and wherein the distribution head comprises a gas dispersion head.

15. A method of chemical vapor deposition comprising:

providing a substrate within a reaction chamber wherein the reaction chamber comprises a lid, a first valve assembly having a first valve closure, a second valve assembly having a second valve closure, and an inert material inlet port, said inert material inlet port being distinct from the valve assemblies and wherein the first and second valve assemblies and the inert material inlet port pass through the lid;

flowing a first material into the reaction chamber through the first valve closure, and depositing at least a portion of the first material onto the substrate;

while flowing the first material into the reaction chamber, purging the the reaction chamber by flowing an inert material through the inert material inlet port into the reaction chamber whereby the inert material passes from the inert material inlet port through a distribution head, said distribution head being within the reaction chamber and between the lid and the first and second valve closures; and after flowing the first material into the reaction chamber, flowing a second material into the reaction chamber through the second valve closure, and depositing at least a portion of the second material onto the substrate.

16. The method of claim 15 wherein the flowing of the inert material is continuous.

17. The method of claim 15 wherein the flowing of the inert material is pulsed.

18. The method of claim 15 further comprising removing the inert material from the reaction chamber through at least one outlet port.

19. The method of claim 15 further comprising flowing the inert material while flowing the second material.

* * * * *